(12) United States Patent
Welz et al.

(10) Patent No.: US 7,830,954 B2
(45) Date of Patent: Nov. 9, 2010

(54) METHOD AND APPARATUS FOR I/Q IMBALANCE COMPENSATION

(75) Inventors: Jared Welz, Seal Beach, CA (US); Henrik Jensen, Long Beach, CA (US)

(73) Assignee: Broadcom Corporation, Irvine, CA (US)

( * ) Notice: Subject to any disclaimer, the term of this patent is extended or adjusted under 35 U.S.C. 154(b) by 885 days.

(21) Appl. No.: 11/452,824

(22) Filed: Jun. 14, 2006

(65) Prior Publication Data
US 2007/0291883 A1 Dec. 20, 2007

(51) Int. Cl.
H04B 1/38 (2006.01)
H04B 17/00 (2006.01)
H03D 3/00 (2006.01)
(52) U.S. Cl. .................... 375/219; 375/322; 455/67.14; 455/73
(58) Field of Classification Search ................ 375/219, 375/271, 284, 285, 316, 322, 324, 329, 346, 375/350; 455/63.1, 67.11, 67.14, 67.16, 455/296, 303, 306
See application file for complete search history.

(56) References Cited

U.S. PATENT DOCUMENTS

2004/0203472 A1* 10/2004 Chien ...................... 455/67.11
2005/0260949 A1* 11/2005 Kiss et al. ................ 455/67.14
2007/0099570 A1* 5/2007 Gao et al. .................. 455/63.1

* cited by examiner

Primary Examiner—Betsy L Deppe
(74) Attorney, Agent, or Firm—Brake Hughes Bellermann, LLP

(57) ABSTRACT

Various embodiments are disclosed relating to a wireless transceiver. In an example embodiment, a method of compensating for phase imbalance and amplitude imbalance between corresponding in-phase signals and quadrature-phase signals includes providing a plurality of test tones of various frequencies to a receiver and determining, for each of the test tones, a respective phase imbalance and a respective amplitude imbalance between an in-phase (I) signal and a quadrature-phase (Q) signal of the test tone. The example method also includes determining a set of filter coefficients based on the determined phase and amplitude imbalances of the plurality of test tones and applying the set of filter coefficients to a plurality of filters. In the example method, a phase imbalance between an I signal and a Q signal of a received wireless signal is compensated for using a first filter of the plurality of filters. Further, an amplitude imbalance between the I and Q signals of the received wireless signal is compensated for using a second filter of the plurality of filters.

19 Claims, 8 Drawing Sheets

US 7,830,954 B2

METHOD AND APPARATUS FOR I/Q IMBALANCE COMPENSATION

BACKGROUND

Wireless transceivers are used in a wide variety of wireless systems. A wireless transceiver may typically include a wireless receiver for receiving and demodulating signals, and a transmitter for modulating signals for transmission. Wireless transceivers may be capable of transmitting and receiving on different frequencies or bands. A common problem in such wireless transceivers is the rejection of image signals.

SUMMARY

The following embodiments and aspects thereof are described and illustrated in conjunction with systems, tools and methods which are given by way of example and meant to be illustrative, not limiting in scope. In various embodiments, one or more of the above-described problems have been reduced or eliminated, while other embodiments are directed to other improvements.

In an example embodiment, a method of compensating for phase imbalance and amplitude imbalance between corresponding in-phase signals and quadrature-phase signals in a wireless receiver includes providing a plurality of test tones of various frequencies to the receiver and determining, for each of the test tones, a respective phase imbalance and a respective amplitude imbalance between an in-phase signal and a quadrature-phase signal of the test tone. In the example method, the respective phase imbalance and the respective amplitude imbalance each have a frequency dependent component. The example method also includes determining a set of filter coefficients based on the determined phase and amplitude imbalances of the plurality of test tones and applying the set of filter coefficients to a plurality of filters. The example method still further includes compensating for a frequency dependent phase imbalance between an in-phase signal and a quadrature-phase signal of a received wireless signal using a first filter of the plurality of filters and compensating for a frequency dependent amplitude imbalance between the in-phase signal and the quadrature-phase signal of the received wireless signal using a second filter of the plurality of filters.

In another example embodiment, a wireless transceiver includes a transmitter adapted to output a series of test tones at various frequencies and a receiver coupled with the transmitter so as to receive the series of test tones from the transmitter. The example transceiver also includes an imbalance measurement circuit coupled with the receiver. In the example transceiver, the imbalance measurement circuit is adapted to (i) determine a respective phase imbalance and a respective amplitude imbalance for each test tone of the series of test tones and (ii) determine a set of filter coefficients based on the determined phase and amplitude imbalances of the series of test tones. The example transceiver further includes a plurality of filters adapted to compensate for a phase imbalance and an amplitude imbalance between an in-phase signal and a quadrature-phase signal of a wireless signal that is received by the wireless transceiver. The filters compensate for the imbalances using the determined filter coefficients.

BRIEF DESCRIPTION OF THE DRAWINGS

Example embodiments are illustrated in referenced figures of the drawings. It is intended that the embodiments and figures disclosed herein are to be considered illustrative rather than restrictive.

DETAILED DESCRIPTION

Wireless System Overview

Figure 1:
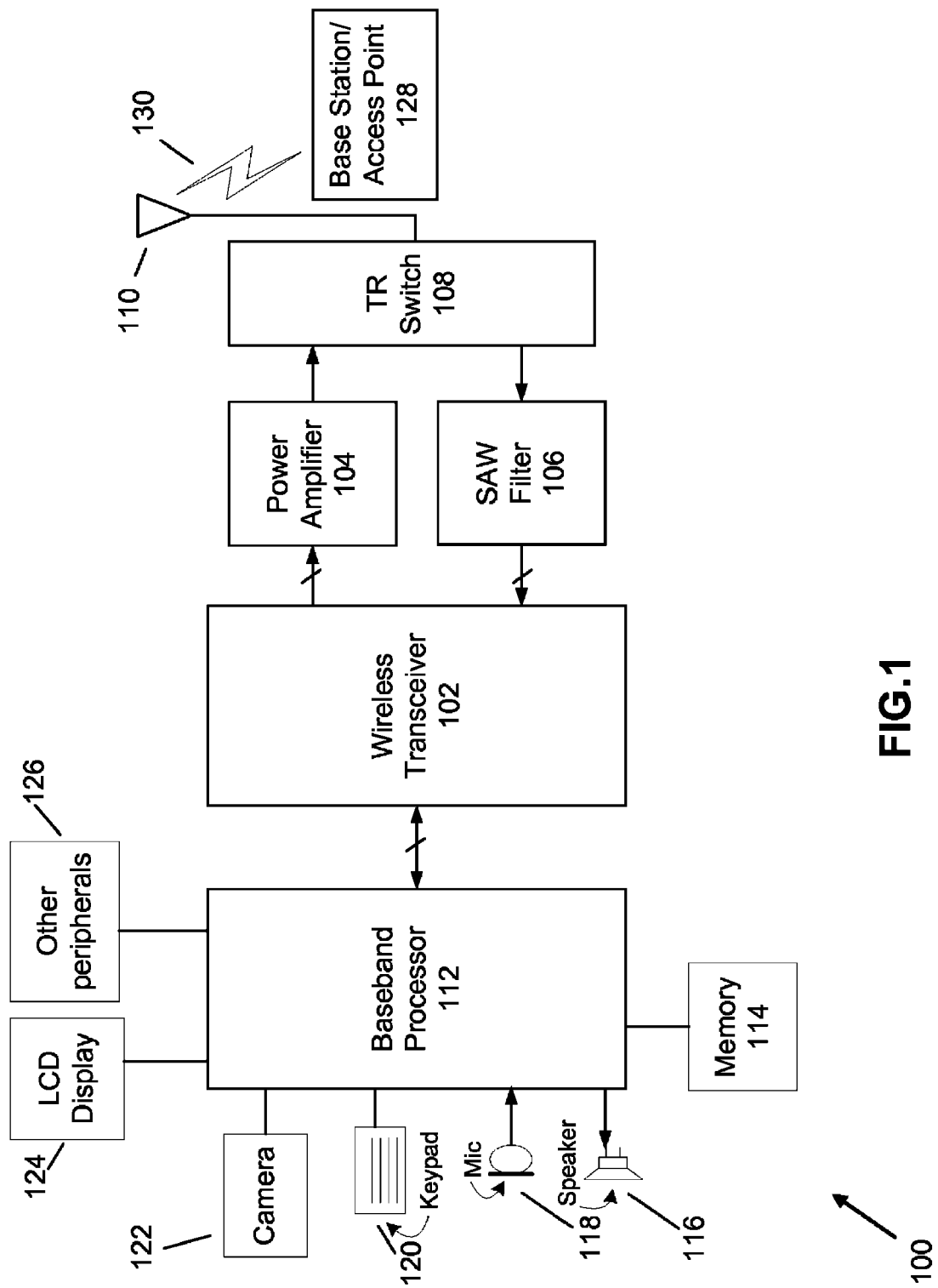
FIG. 1 is a block diagram illustrating an example wireless system.

FIG. 1 is a block diagram of a wireless system according to an example embodiment. Wireless system 100 may include a wireless transceiver (transmitter/receiver) 102 for transmitting and receiving radio or wireless signals. A baseband processor 112 is coupled to wireless transceiver 110 to perform various types of processing and overall control of system 100. Baseband processor 112 may, of course, perform other tasks. Baseband processor 112 may include a controller, and may also include for example, an audio codec to process audio signals, a video or image processing codec (e.g., an MPEG4 compression and/or decompression module), and other components or blocks, not shown.

An antenna 110 may be provided to receive and transmit radio signals or electromagnetic signals. A transmitter/receiver (TR) switch 108 may select either the transmit or receive mode for the antenna 110. Signals output by wireless transceiver 102 to be transmitted may be amplified by amplifier 104 and then transmitted via antenna 110. Signals received via antenna 110 may be filtered by a SAW (surface acoustic wave) filter 106 (or other filter) and then input to transceiver 102. At transceiver 102, the received signals may be processed or demodulated, which may include down-converting the signals to an intermediate frequency (IF) and then down-converting to baseband or other frequency, digital detection of data and other signal processing. Likewise, digital data to be transmitted may be received by transceiver 102 from baseband processor 112. Wireless transceiver 110 may modulate the digital data from baseband processor 112 onto a selected channel or frequency (or range or spectrum of frequencies) for transmission over antenna 110.

Wireless signals may be communicated to and from wireless transceiver 102 (e.g., via power amplifier 104, SAW filter 106 and antenna 110) from a base station and/or access point (AP) 128 (hereafter AP 128). The wireless signals communicated between wireless transceiver and AP 128 may be communicated over an air interface 130 using any number of communication protocols, such as the protocols discussed herein, for example. The wireless signals communicated between wireless transceiver 102 and AP 128 may include voice information, streaming media (audio and/or video), packet data (such as Internet Protocol packet data), or any other information that is suitable for communication using such wireless signals.

In wireless system 100, a variety of blocks or peripherals may be coupled to baseband processor 112. For example, a memory 114, such as a Flash memory or Random Access Memory (RAM), may store information. A microphone 118 and speaker 116 may allow audio signals to be input to and output by wireless system 100, such as for a cell phone or other communications device. A keypad 120 may allow a user to input characters or other information to be processed by wireless system 100. A camera 122 or other optical device may be provided to allow users to capture photos or images that may be processed and/or stored by system 100 in memory or other storage location. Wireless system 100 may also include a display 124, such as a liquid crystal display for example, to display information (text, images, etc.). A variety of other peripherals 126 may be coupled to baseband processor 112, such as a memory stick, an audio player, a Bluetooth wireless transceiver, a USB (Universal Serial Bus) port, or other peripheral. These are merely a few examples of the types of devices or peripherals that may be provided as part of wireless system 100 or coupled to baseband processor 112, and the disclosure is not limited thereto.

Wireless system 100 may be used in a variety of systems or applications, such as a mobile or cellular phone, a wireless local area network (WLAN) phone, a wireless personal digital assistant (PDA), a mobile communications device, or other wireless device. In an example embodiment, wireless system 100 may be capable of operating in a variety of transmit/receive frequencies or frequency bands and for a variety of different standards or communications protocols. Although not required, wireless system 100 may be a multi-band wireless system capable of transmitting or receiving signals on one of a plurality of frequencies or bands. For example, wireless system 100 may operate at or around 1900 MHz for WCDMA (Wide-Band Code Division Multiple Access) or PCS (Personal Communications Services), at or around 1800 MHz for DCS (Distributed Communication Services) (these frequencies may be considered an upper band of frequencies), at 850 MHz for GSM (Global System for Mobile communication), at or around 900 MHz for EGSM (Extended GSM) (these frequencies may be considered a lower band of frequencies). These are merely some example frequencies, and the system 100 may operate at many other frequencies and standards.

Example Wireless Transceiver

Figure 2:
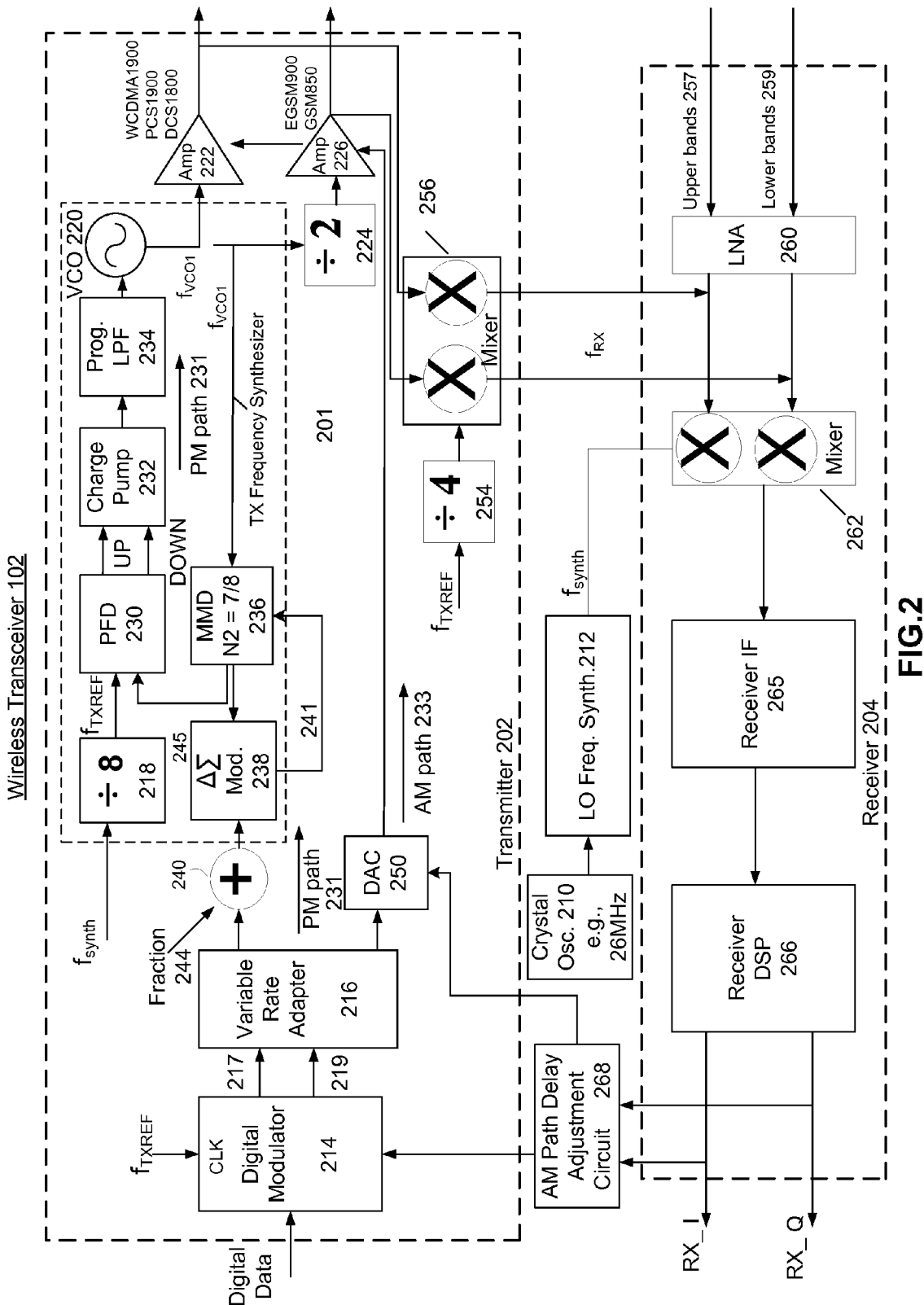
FIG. 2 is a block diagram illustrating a wireless transceiver that may be implemented in the wireless system of FIG. 1.

FIG. 2 is a block diagram of a wireless transceiver according to an example embodiment. Wireless transceiver 102 may include a transmitter 202 to modulate and transmit data, and a receiver 204 to receive and demodulate data. A crystal oscillator 210 may generate a signal at a constant frequency, such as 26 MHz or other frequency (26 MHz is merely an example and other frequencies may be used). A local oscillator (LO) frequency synthesizer 212 may generate a synthesized frequency signal ($f_{synth}$) at a selected one of a plurality of frequencies, e.g., based on a selected channel. The synthesized frequency signal ($f_{synth}$) may be used by both the transmitter 202 and receiver 204 as a reference signal. Alternatively, synthesized frequency signals may be generated separately for the transmitter 202 and receiver 204.

A digital modulator 214 may receive digital data and output data onto one or more paths. According to an example embodiment, transmitter 202 may modulate received data using a variety of Phase Shift Keying (PSK), such as 8PSK, Quadrature Amplitude Modulation (QAM), etc., in which data may be modulated using both phase modulation and amplitude modulation. Digital modulator 214 may alternatively modulate received data using phase modulation or frequency modulation, or variations thereof, such as Gaussian-Filtered Minimum Shift Keying (GMSK), or the like. According to an example embodiment, for such a phase modulation or frequency modulation or GMSK modulation, or the like, the amplitude of the signal output by transmitter 202 may be, for example, set to a constant amplitude or level.

To be able to accommodate different frequencies and different channels, $f_{synth}$ may be a variable frequency between, for example, 1.752 GHz and 2.0 GHz. This is merely an example frequency range, and other frequencies or frequency ranges may be used. $f_{synth}$ may be frequency divided by frequency divider 218 to generate a transmit reference frequency ($f_{TXREF}$). In an example embodiment, frequency divider 218 may be a divide by 8. Therefore, $f_{TXREF}$ may be generated as $f_{synth}/8$, and in such a case, $f_{TXREF}$ may vary between 219 MHz and 250 MHz, for example.

Digital modulator 214 may receive digital data and output signals on both lines 217 and 219 to a variable rate adapter 216. In an example embodiment, digital modulator 214 may use $f_{TXREF}$ as a clock. As noted, $f_{TXREF}$ may be a variable frequency. Variable rate adapter 216 may compensate for the variable rate clock ($f_{TXREF}$) that may be used by digital modulator 214, e.g., such that signals output by variable rate adapter 216 may be output at a constant frequency even though the clock signal (e.g., $f_{TXREF}$) for digital modulator 214 may vary.

In order to perform both phase modulation (PM) (or a variation thereof) and amplitude modulation (AM) on the received digital data, such as for 8PSK or QAM or the like, variable rate adapter 216 may output signals onto two paths including: (i) a PM path 231 to perform phase modulation based on received data; and (ii) an AM path 233 to perform amplitude modulation based on the received data.

The PM path will now be discussed. In the PM path 231, a transmit frequency synthesizer 201 may include a phase-locked loop (PLL) and a delta-sigma modulator 238. Within the transmit frequency synthesizer 201, a voltage controlled oscillator (VCO) 220 may output a signal at an operating frequency for a selected channel for a selected band of a service (e.g., channel number 2 at a center frequency of 1710.2 MHz for DCS). For example, a base station or Access Point (AP) may assign the wireless system 100 a channel to use for data transmission. As described in more detail below, VCO 220 may output a range of frequencies or a modulated frequency spectrum for the selected channel, with the data being modulated onto the frequency spectrum. VCO 220 may also include a gain, or an amount which the output spectrum from VCO 220 is amplified. This gain (K) of VCO 220 may be referred to as $K_{VCO}$. In an example embodiment, the gain of VCO 220 ($K_{VCO}$) may be calibrated.

The frequency spectrum output by VCO 220 may then be amplified by upper band amplifier 222 for transmission via antenna 110. The frequency spectrum output by VCO 220 may also be divided by two by frequency divider 224 and then amplified by lower band amplifier 226 for data transmission over antenna 110. Thus, according to an example embodiment, a frequency spectrum for a selected channel in the upper band of frequencies may be amplified and output by amplifier 222, while a frequency spectrum for a selected channel in the lower band of frequencies may be amplified and output by amplifier 226.

As noted above, transmit frequency synthesizer 201 may include a PLL. According to an example embodiment, the phase-locked loop (PLL) within transmit frequency synthesizer 201 may control or lock the VCO 220 to a desired or selected operating frequency (e.g., corresponding with a particular channel). The PLL within transmit frequency synthesizer 201 may include, for example, a phase-frequency detector (PFD) 230, a charge pump 232 and a programmable low pass filter (LPF) 234 (also referred to as a loop filter). Depending on the particular embodiment, the PLL of the transmit frequency synthesizer 201 may include other and/or different components, and this is merely an example PLL. The output ($f_{VCO1}$) of VCO 220 may include an operating frequency of a selected channel (e.g., center frequency). An integer-N (frequency) divider 236 is coupled to the feedback loop of the PLL, and may divide a received frequency by a selected divider number (e.g., an integer, either 7 or 8). The output frequency of VCO 220 ($f_{VCO1}$) is divided by a divider number (N2) of integer-N divider 236 that is selected by a 1-bit delta-sigma ($\Delta\Sigma$) modulator 238 via line 241.

Integer-N divider 236 may be considered to be a multi-modulus divider (MMD) since the divider number (N2) used by integer-N divider 236 may be one of multiple different numbers (integers). The transmit frequency synthesizer 201 may provide a selected fractional-N divide ratio (average N2) by dynamically switching the divider number (N2) of integer-N divider 236 between two or more integer numbers. Thus, transmit frequency synthesizer 201 may be considered to be a fractional-N frequency synthesizer.

In an example embodiment, the divider number used by integer-N divider 236 may be either 7 or 8, based on the signal (bit) received from delta-sigma modulator 238 via line 241 (e.g., a 0 output on line 241 by modulator 238 to indicate a 7 for the divider number N2, while a 1 indicating an 8 for divider number N2). Therefore, according to an example embodiment, the operating frequency output by VCO 220 may be $f_{VCO1}=N2*f_{TXREF}$. The integer divider numbers of 7 or 8 may allow only two operating frequencies to be output by VCO 220 for a particular $f_{TXREF}$ (transmitter reference frequency). However, by varying the selected integer divider number used by integer-N divider 236, almost any (average) fractional-N divide ratio (average N2) between 7 and 8 may be obtained, which may allow VCO 220 to output a range of frequencies.

In order to lock or control the VCO 220 to a desired selected output frequency (for the selected channel), a $f_{synth}$ (and thus $f_{TXREF}$) is selected, and an average fractional-N divide ratio (average N2) is selected between 7 and 8 (in this example embodiment, although any numbers may be used) that will provide the selected operating frequency output by VCO 220. For example, if a transmit operating frequency of 1.661 GHz is assigned or selected, then a transmit reference frequency ($f_{TXREF}$) of 220 MHz may be selected, and a (average) fractional-N divide ratio of 7.55 may be used. Thus, in this example, a VCO output (operating frequency for the channel) is thus obtained as: $f_{VCO1}=N2$ (average)*$f_{TXREF}$, which in this case may be calculated as: $f_{VCO1}=7.55*220$ MHz=1.661 GHz, which is the desired operating frequency (e.g., center frequency for the assigned transmission channel).

The fractional-N divide ratio (7.55 in this example) between 7 and 8 may be obtained by using delta sigma modulator 238 to vary the divider number (N2) of integer-N divider 236 to divide by 7 and divide by 8 an appropriate amount or percentage of time to obtain the selected (average) fractional-N divide ratio (average N2). For example, to obtain a fractional-N divide ratio of 7.5, the integer-N divider 236 would divide by 7 half of the time, and divide by 8 the other half of the time (50% duty cycle, half zeroes, half ones). By changing the duty cycle or percentage of zeros and ones output by delta sigma modulator 238 via line 241, the frequency ($f_{VCO1}$) received via line 243 may be divided by a selected fractional-N divide ratio (e.g., 7.55).

The fractional portion (0.55 in this example) of the selected fractional divider number (7.55 in this example) may be input to combiner 240. Combiner 240 may add or combine the fraction 244 (0.55 in this example) with a data signal (to provide phase modulation) output by variable rate adapter 216. The output of combiner 240 may control delta-sigma modulator 238 to obtain the (average) selected fractional-N divide ratio for transmit frequency synthesizer 201.

In an example embodiment, VCO 220 may not necessarily output a single tone or frequency, but rather, may output a modulated frequency spectrum, such as a phase modulated spectrum. In an example embodiment, the delta sigma modulator 238 may control the integer-N divider 236 to vary the divider number (N2) around the selected fractional divide ratio so as to cause VCO 220 to generate a phase modulated frequency spectrum. In part, the delta sigma modulator 238 may be controlled based on signals output via line 217 from digital modulator 214 (e.g., to allow phase modulation of the output signal output from VCO 220), and passed through (e.g., after compensation) by variable rate adapter 216. This may allow the output from VCO 220 ($f_{VCO1}$) to be a phase modulated frequency spectrum around a center frequency for the selected channel (the operating frequency selected by the fractional-N divide ratio, such as 7.55, for example).

Those of skill working in this area will appreciate that a local oscillator (LO) frequency synthesizer 212 of FIG. 2 may be very similar in structure and operation to the transmit frequency synthesizer 201 in FIG. 2, but may vary in certain respects. For instance, the LO frequency synthesizer 212 may include a frequency divider between the VCO 220 and the integer-N (frequency) divider 236, where the synthesized frequency is generated by the frequency divider. Additionally, the integer-N divider 236 may use different divider numbers for the LO frequency synthesizer 212 (e.g., 64 and 70). These variations are merely examples and any number of other implementation techniques may be used. For purposes of brevity and clarity, the LO frequency synthesizer 212 will not be discussed in further detail here. The particular implementation details of the LO frequency synthesizers 201 and 212 will depend, in part, on the particular application.

Operation of the example PLL of transmit frequency synthesizer 201 of transmitter 202 will now be briefly described. The transmitter reference frequency ($f_{TXREF}$) is input as a reference signal to PFD 230. The divided frequency signal output on line 245 from divider 236 is a second input to PFD 230. PFD 230 may generate an output signal(s) based on the phase difference between its two input signals. For example, an up signal or a down signal may be output by PFD 230 based on whether the divided frequency signal on line 245 leads or lags the reference frequency signal ($f_{TXREF}$), respectively. Charge pump 232 may generate positive or negative charge pulses based on whether the divided frequency signal on line 245 leads or lags the reference signal ($f_{TXREF}$), respectively. Programmable low pass filter (LPF) 234 may integrate or accumulate the charge pulses to generate a voltage, which, for example, may indicate the amount that the divided frequency signal on line 245 leads or lags the reference signal ($f_{TXREF}$). The voltage output by LPF 234 may control or adjust the frequency ($f_{VCO1}$) output by VCO 220.

Thus, via the PM path 231, VCO 220 may output a phase modulated frequency spectrum, which is then amplified and output by upper band amplifier 222. Similarly, the output from VCO 220 is divided by two by divider 224, and is then amplified and output by lower band amplifier 226.

In an example embodiment, LPF 234 (of the PLL) may set the loop bandwidth of the PLL. If the bandwidth of the LPF is too narrow, part of the output spectrum from VCO 220 may be clipped or distorted. Likewise, if the bandwidth of LPF 234 is too wide, this may introduce an unacceptable amount of noise into the system. Therefore, according to an example embodiment, a relatively narrow bandwidth may be used for LPF 234, such as 200 KHz (this is merely an example, and other bandwidths may be used). Also, in an example embodiment, digital modulator 214 may include an equalizer to account for some clipping or signal distortion that may occur due to the 200 KHz bandwidth of low pass filter (LPF) 234. In an example embodiment, LPF 234 may be an R-C (resistor-capacitor) filter, where the R-C filter may be calibrated.

In cases in which the transmitted signal may be both phase modulated and amplitude modulated, such as for 8PSK, QAM or the like, the AM path 231 may perform amplitude modulation on the phase modulated spectrum based on the received digital signals, as described below. As noted, the digital data is received by digital modulator 214. The digital modulator 214 may output data via two paths, to provide both phase modulation (via PM path 231) and amplitude modulation (via AM path 233).

The AM path 233 will now be briefly described. Digital modulator 214 outputs signals (e.g., via variable rate adapter 216) to digital-to-analog converter (DAC) 250. DAC 250 converts received digital signals to analog signals. The analog signals, which may represent or indicate an amplitude, are input to amplifiers 226 and 222. Amplifiers 226 and 222 may amplitude modulate (or vary the amplitude) of the phase modulated spectrum provided from the VCO 220 based upon the signals received from DAC 250 via AM path 233. Thus, signals received via the AM path 233 may control the amplitude or gain of the phase modulated signals (spectrum) output by transmitter 202. Therefore, amplifiers 222 and 226 may output an amplitude and phase modulated signal (e.g., frequency spectrum), according to an example embodiment.

In cases where only phase or frequency modulation is performed (such as, for example, GMSK for GSM and EGSM), then the amplitude value output by digital modulator 214 to DAC 250 may be set to a constant level, to provide a constant amplitude for the phase modulated spectrum output by amplifiers 222 and 226. In an embodiment, the constant amplitude used by DAC 250 for such modulations may be typically set to a maximum to provide a high saturated output power.

Receiver 204 of wireless transceiver 102 (FIG. 2) will now be briefly described. Wireless signals may be input to receiver 204, including upper (or high) band signals received via line 257, and lower band signals received via line 259. These received signals may be amplified by low noise amplifier (LNA) 260. During normal operation, the received wireless signal may be down converted by mixer 262, based on the synthesizer frequency ($f_{synth}$) output by LO frequency synthesizer 212 (e.g., the received signal may be mixed with $f_{synth}$ by mixer 262 to generate intermediate frequency (IF) signals. In an example embodiment, the received signal may then be down converted to an IF signal whose spectrum is located in a frequency band centered at 200 KHz, for example (although any frequency may be used for IF). The IF signals may be input to receiver IF block 265 (which may include, for example, filters, gain control and other circuits) where IF processing is performed. The signals output by receiver IF block 265 are input to a receiver DSP 266, which may include, for example, gain control and digital signal processor to down convert the IF signal to baseband and perform image rejection. Receiver DSP 266 may output in-phase and quadrature-phase receive signals (RX_I, RX_Q, respectively). The receive signals (RX_I and RX_Q) may also be output to digital modulator 214 (connection not shown), and also to an AM path delay adjustment circuit 268.

Wireless systems, such as wireless system 100 shown in FIG. 1, at least in some cases, may be required to meet one or more signal quality requirements. For example, some wireless technologies may require wireless signals, both transmitted and received, meet (or fall within) a given spectral mask and have a certain signal to noise ratio within that spectral mask.

I/Q Phase and Amplitude Imbalance

Figure 3:
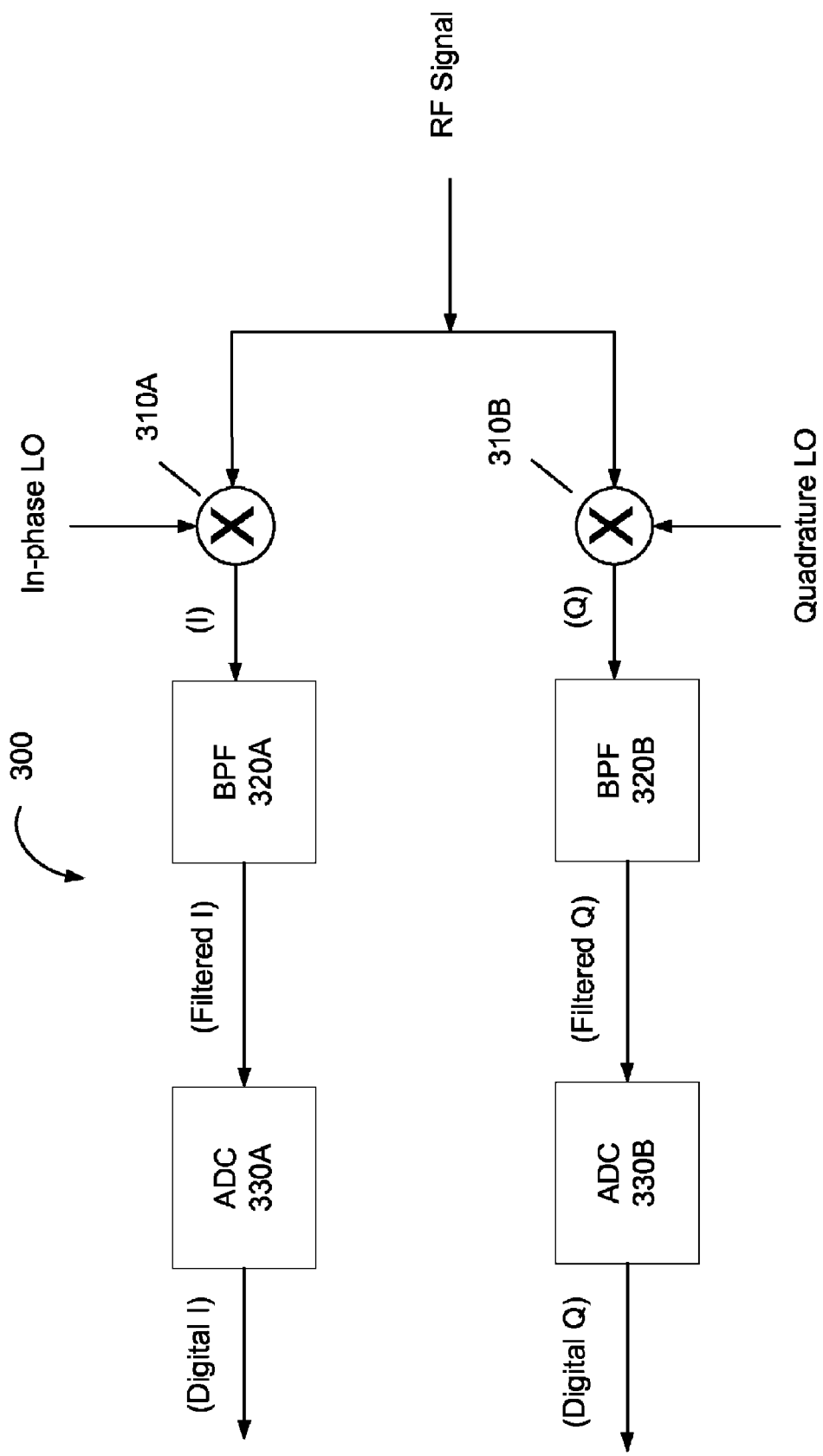
FIG. 3 is a block diagram illustrating a receiver quadrature intermediate frequency circuit.

FIG. 3 is a block diagram illustrating a circuit 300 that may be used as a portion of an example receiver, such as the receiver 204 of FIG. 2. For instance the circuit 300 may be implemented as mixer 262 and receiver IF 265 in receiver 204. In the circuit 300, a radio-frequency (RF) signal is received and provided to local oscillator (LO) mixers 310A and 310B. As described above, the received RF signal may be an upper band RF signal or a lower band RF signal, depending on the particular communication channel corresponding with the frequency of the received RF signal. Additionally, as was described above with respect to transmitter 202 of the wireless transceiver 102, the received RF signal in FIG. 3 may be a phase modulated signal or a phase and amplitude modulated signal. Alternatively, the received RF signal may also take any number of other appropriate forms. For example, the received RF signal may have a substantially constant phase and substantially constant amplitude.

Using mixers 310, the received RF signal may be down converted to an in-phase IF signal (I) with mixer 310A and a quadrature-phase IF signal (Q) with mixer 310B. The RF signal is down converted to the I and Q IF signals using, respectively, an in-phase LO signal and a quadrature-phase LO signal. In an example embodiment, the in-phase LO signal and the quadrature-phase LO signal may be phase shifted with respect to each other, so as to introduce a corresponding phase shift between the I and Q signals produced by the mixers 310. Such a phase shift may be, in an example embodiment, 90 degrees, though other phase shifts are possible. For purposes of consistency in this disclosure, the particular embodiments disclosed herein will be described as using a 90 degree phase shift.

The down converted I and Q IF signals are then provided to band pass filters 320A and 320B, respectively. The band pass filters (BPFs) 320 may be adjustable band pass filters that filter the I and Q signals to remove signals and/or noise outside an IF frequency signal band (e.g., signals and/or noise outside a frequency range of 100 KHz to 300 KHz for IF signals of 200 KHz) to produce filtered I and Q signals. The filtered I and Q signals may then be provided to analog-to-digital converters (ADCs) 330A and 330B, respectively. The ADCs 330 may then convert the filtered I and Q signals to digital form. The digital I and digital Q signals may then be provided, for example, to receiver DSP 266.

Receiver DSP 266 may perform any number of signal processing operations on the digital I and Q signals, such as down conversion to baseband and image signal rejection. An image signal may, for example, be a signal whose spectrum resides in a frequency band centered at two times the intermediate frequency away from the desired RF frequency. For example, in a receiver using low-side injection (e.g., the LO signal is set at a frequency that is equal to the RF frequency of the selected channel minus the desired intermediate frequency) an image frequency of the selected channel is located at the LO frequency minus the desired intermediate frequency (e.g., 2*IF away from the desired RF frequency of the selected channel).

For instance, if an IF frequency of 200 KHz is desired and an RF signal for a selected channel of 900.2 MHz is received, the LO frequency for the in-phase and quadrature-phase LO signals in a receiver using low-side injection may be set at 900 MHz with a 90 degree phase shift with respect to one another. In this situation, the image signal may comprise spectrum within a frequency band that is centered at 899.8 MHz (e.g., a signal at −200 KHz with respect to the LO frequency, or 2*IF (400 KHz) below the selected channel frequency). The image signal may include information from another wireless communication channel, signal noise, or may originate from any number of other sources in the RF domain.

As with the desired signal, the image signal may be referred to as being present in an image band. In this particular example, the image band may be between 899.9 MHz and 899.7 MHz (e.g., between −100 KHz to −300 KHz from the LO signal frequency and centered at −200 KHz from the LO frequency). As the name implies, the image band may "mirror" the desired signal band, which, for this example embodiment, is present at 900.1 MHz to 900.3 MHz (e.g., between 100 KHz to 300 KHz from the LO frequency and centered at 200 KHz from the LO frequency, or at 900.2 MHz, the selected channel frequency for this example).

Due to the operation of the mixers 310 (which generate both sums and differences of the incoming RF spectrum and the LO signals), the image signal may be down converted to the intermediate frequency along with the desired signal (e.g., signal information from the selected channel). Because both the desired signal and the image signal are down converted to IF, the BPFs 320 may typically pass the desired IF signal at 200 KHz relative to the LO frequency and also pass the image signal at −200 KHz relative to the LO frequency. Therefore, in this example embodiment, the BPFs 200 may provide signals from both the desired IF signal band and the image band to the ADCs 330.

The ADCs 330, in this situation, will then convert both the desired signal information and the image signal information to digital form and provide digital I and Q signals including both desired signal band information and image band signal information to the receiver DSP 266. The receiver DSP 266 may then perform further signal processing, including down conversion to baseband and rejection of the image signal based on the digital I and Q signals received from the ADCs 330.

The required amount of image rejection depends on the particular embodiment. For instance, the GSM specification may require an image rejection ratio (e.g., the ratio of the gain experienced by the desired signal to that of the image signal from the receiver input to the baseband processor) of at least 50 dB for receivers using an intermediate frequency of 200 KHz. In order for the DSP 266 to adequately reject such image signals, it may be desirable that the amplitudes of the I and Q signals are substantially the same and that the phase relationship between the signals is substantially the same as the expected phase relationship, such as substantially 90 degrees of phase separation in this example. If there is a difference in the amplitude between the I and Q signals, this difference may be considered an amplitude imbalance. Likewise, for this example, if there is phase difference between the I and Q signals that is different than 90 degrees, this may be considered a phase imbalance.

For the circuit 300 shown in FIG. 3, phase imbalances (e.g., deviation from 90 degrees of phase separation) and amplitude imbalances (e.g., differences in signal amplitude between the I and Q signals) that are introduced into the I and Q IF signals (including the filtered I and Q IF signals) may prevent effective rejection of the image signal by the receiver DSP 266. This situation is undesirable as it will reduce the quality of service in a wireless system.

Two sources of imbalance between the I and Q IF signals are the LO mixers 310 and the BPFs 320. For instance, because the mixers 310 and the BPFs 320 are not perfectly matched (e.g., have variations in their circuit parameters) the mixers 310 and the BPFs 320 may introduce phase and amplitude imbalances into the digital I and Q signals as a result of imbalances that are introduced into the I and Q IF signals and the filtered I and Q IF signals by the LO mixers 310 and the BPF filters 320.

In an example embodiment, the mixers 310 may introduce imbalances that are essentially constant across all frequencies in the IF frequency band e.g., frequency independent imbalances), while the BPFs may introduce imbalances that depend on the frequencies in the IF frequency band (e.g., frequency dependent imbalances). For example, the imbalances contributed by the mixers 310 across the 100 KHz to 300 KHz IF band are typically constant whereas those from the BPFs 320 typically depend on the particular frequency (e.g., the imbalances at 150 KHz may be different from those at 250 KHz). As those working in this area will appreciate, such imbalances may be expressed in terms of a gain value (for amplitude imbalances) and in terms of one or more trigonometric functions (for phase imbalances). The gain values and trigonometric functions used to express the imbalances of a receiver will depend on the particular embodiment.

In certain situations, it may be sufficient to compensate for the frequency independent imbalances that are introduced by the LO mixers 310 and effectively ignore the frequency dependent imbalances that are introduced by the BPFs 320. In such situations, the frequency independent imbalances may be compensated for by using single gain elements (not shown). For instance, a frequency independent phase imbalance between an in-phase signal and a quadrature-phase signal in the circuit 300 may be compensated for by using a gain element coupled between the quadrature-phase signal path and the in-phase signal path. Similarly, a frequency independent amplitude imbalance between the in-phase signal and the quadrature-phase signal in the circuit 300 may be compensated for using a gain element that is included in either the in-phase signal path or the quadrature-phase signal path. Such compensation may be referred to asymmetric I/Q compensation as compensation for each imbalance occurs by modifying only one of the I and Q signals, not both.

However, in certain embodiments, as was discussed above, an image rejection ratio of at least 50 dB may be required. In such circumstances, merely compensating for the frequency independent phase and amplitude imbalances that are introduced by the mixers 310 may be insufficient to allow for adequate rejection of such image signals. Therefore, in order to comply with such signal quality requirements (e.g., rejection of such an image signal), it may be desirable to compensate for both the frequency independent imbalances (introduced by mixers 310) and the frequency dependent imbalances (introduced by the BPFs 320). Because single gain elements are insufficient to compensate for frequency dependent imbalances, alternative approaches for imbalance compensation that allow for compensating (asymmetrically or otherwise) for the frequency dependent imbalances introduced by the BPFs 320 (or other circuit elements) are desirable. It is also desirable that such techniques also compensate for frequency independent imbalances (e.g., such as imbalances that are introduced by a quadrature mixer).

Example Receiver with I/Q Compensation Module

Figure 4:
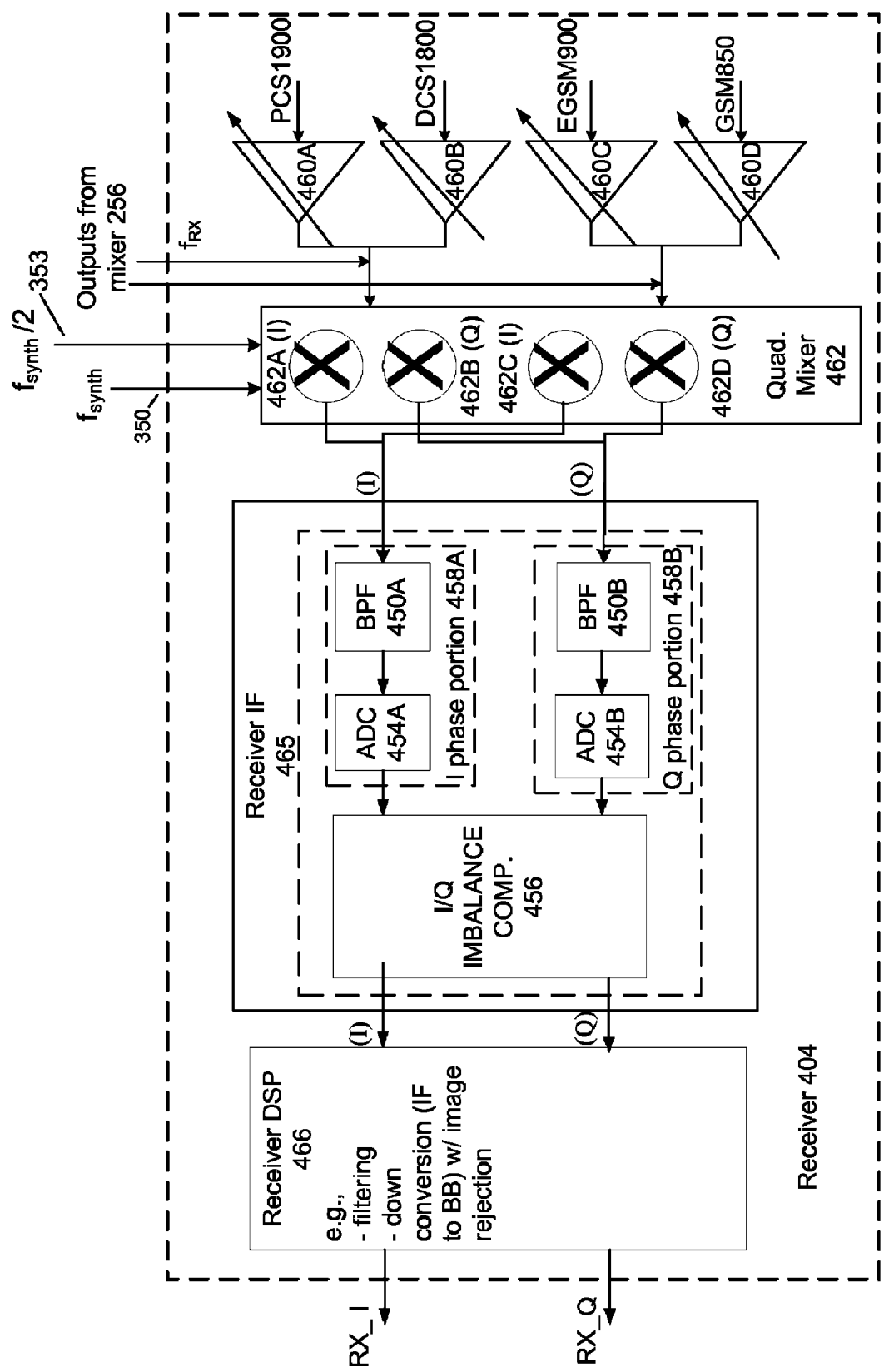
FIG. 4 is a block diagram illustrating a receiver that may be alternatively implemented in the wireless transceiver of FIG. 2.

FIG. 4 is a block diagram illustrating an example receiver 404 that may be used to compensate for both frequency dependent and frequency independent imbalances in I and Q signals. Receiver 404 shown in FIG. 4 may replace (or be substituted for) receiver 204 in wireless transceiver 102 (FIG. 2), for example. In the receiver 404, variable gain LNAs 460 may receive RF signals from different bands. For example, LNA 460A may receive signals from PCS1900, LNA 460B may receive signals from DCS1800, LNA 460C may receive signals from EGSM900, and LNA 460D may receive signals from GSM850. As noted above, the PCS1900 and DCS1800 may be considered an upper band of RF signals, while EGSM900 and GSM850 may be considered a lower band of RF signals. In an example embodiment, in operation (e.g., non-calibration) mode, only one of LNAs 460 is active at a time given time. The particular LNA 460 that is active is based on a channel that has been selected or assigned to wireless transceiver 102 for receiving wireless (RF) signals.

Quadrature local oscillator (LO) mixers 462 are coupled to the LNAs 460 to down convert the received wireless (RF) signal to an IF signal or signals (e.g., at 200 KHz). For the receiver 400, an output of upper band LNAs 460A and 460B is input to in-phase mixer 462A and quadrature-phase mixer 462B to generate in-phase (I) and quadrature-phase (Q) signals, respectively, at IF based on a mixing signal ($f_{synth}$) input to mixers 462 via line 350. Similarly, an output from lower band LNAs 460C and 460D are input to in-phase (I) mixer 462C and quadrature-phase (Q) mixer 462 D. In-phase mixer 462C and quadrature-phase mixer 462D generate in-phase (I) and quadrature-phase (Q) signals, respectively, at IF based on the received lower band RF signal (e.g., GSM850 signal or EGSM900 signal) and based on a mixing signal ($f_{synth}/2$) input to mixers 462 via line 353. Quadrature-phase mixers 462B and 462D may also, for example, introduce a 90 degree phase offset (or other predetermined phase offset).

A receiver IF block 465 is coupled to an output of mixers 462 to perform IF processing. The in-phase (I) and quadrature-phase (Q) signals output by mixers 462 are input to an in-phase portion 458A and a quadrature-phase portion 458B, respectively, of receiver IF block 465. In-phase portion 458A may include, for example, a tunable (or adjustable) band-pass filter (BPF) 450A to filter the received analog I signal, and an analog-to-digital converter (ADC) 454A to convert the filtered analog in-phase signal to a digital form.

Similarly, a Q-phase portion 458B of receiver IF block 465 may include a BPF 450B and an ADC 454B to similarly process the quadrature-phase (Q) signal from mixers 462. In an example embodiment, BPFs 450 may also include a variable gain. In another example embodiment, ADCs 454A and 454B may be of a relatively high dynamic range, 14-bit delta-sigma ($\Delta\Sigma$) ADCs, with, for example, approximately 88 dB or more of dynamic range. The use of relatively high dynamic range ADCs may, for example, allow a wide range of signal amplitudes to be received (including both a desired signal and an image signal(s)) and converted to digital form without saturating the ADC. This is merely one example embodiment for ADCs 454, and others may be used.

The use of an IF frequency at or around 200 KHz with a signal bandwidth substantially less than 200 KHz (while having rigorous image rejection requirements in certain circumstances) has the advantage that BPFs 450A and 450B may effectively or substantially filter the I and Q IF signals to remove a DC offset in the analog I and Q signals. Furthermore, using an IF frequency of 200 KHz in the receiver 404 also has the advantage of being less sensitive to flicker and other low-frequency noises, and may have a higher IIP2 (second order input intercept point) than lower IF frequencies, such as 100 KHz with a 200 KHz signal bandwidth, for example, or receivers that perform direct conversion from RF to baseband.

However, as was discussed above, receivers, such as the receiver 404, that use a 200 KHz IF may present some challenges in the rejection or cancellation of image signals. In like fashion as was described above with respect to the circuit 300, due to the operation of mixers 462, an image signal at an image frequency that may be, for example 2*IF away from the desired (channel) frequency may typically be received and also down converted to the IF frequency by mixers 462. As with the BPFs 320 of the circuit 300, the BPFs 450A and 450B may pass both the desired signal (at 200 KHz relative to the LO frequency) and the image signal (at −200 KHz relative to the LO frequency) to the ADCs 454.

As discussed above with respect to FIG. 2 (and receiver DSP 266), without compensating for phase and amplitude imbalances in the I and Q signals, a receiver digital processor, such as a digital signal processor (DSP) 466, may not be able to effectively reject the image signal that is down converted to IF along with the desired signal, as is discussed in more detail. Such I/Q imbalances, as discussed above, may be frequency independent (e.g., such as imbalances introduced by the mixers 462) or may be frequency dependent (e.g., such as imbalances introduced by the BPFs 454). In order to compensate for these frequency dependent and independent imbalances, the receiver 404 includes an I/Q imbalance compensation module 456. An example embodiment of the I/Q imbalance compensation module 456 is described in further detail below with reference to FIGS. 5 and 6. Further, a method for compensating for I/Q imbalance that may be implemented in the receiver 404 is described in further detail below with respect to FIGS. 7 and 8.

Briefly, the I/Q imbalance compensation module 456 (compensation module 456) may dynamically compensate for I/Q imbalance (e.g., frequency dependent and independent imbalance) using the following approach. First, a series of test tones may be provided to the receiver 404 and I/Q imbalances may be determined for each test tone. Second, the compensation module may determine a set of filter coefficients based on the determined I/Q imbalances of the test tones and apply the coefficients to a plurality of filters included in the compensation module 456. Third, the compensation module 456 may compensate for I/Q imbalance in digital I and Q signals corresponding with a received wireless (RF) signal.

For the receiver 404, the digital I and Q signals output from receiver IF 465 (after I/Q compensation) are input to receiver DSP 466 for further processing as digital signals (digital processing). For example, receiver DSP 466 may perform additional filtering, gain (amplitude), phase control, image rejection and down conversion to baseband for each of the received digital I and Q IF signals. For the receiver 404, because I/Q imbalance is compensated for using the compensation module 456, image rejection may be readily performed by the receiver DSP 466 using any number of techniques. Such image rejection techniques are known, and for purposes of brevity and clarity are not described in detail here.

I/Q Imbalance Compensation Circuit

Figure 5:
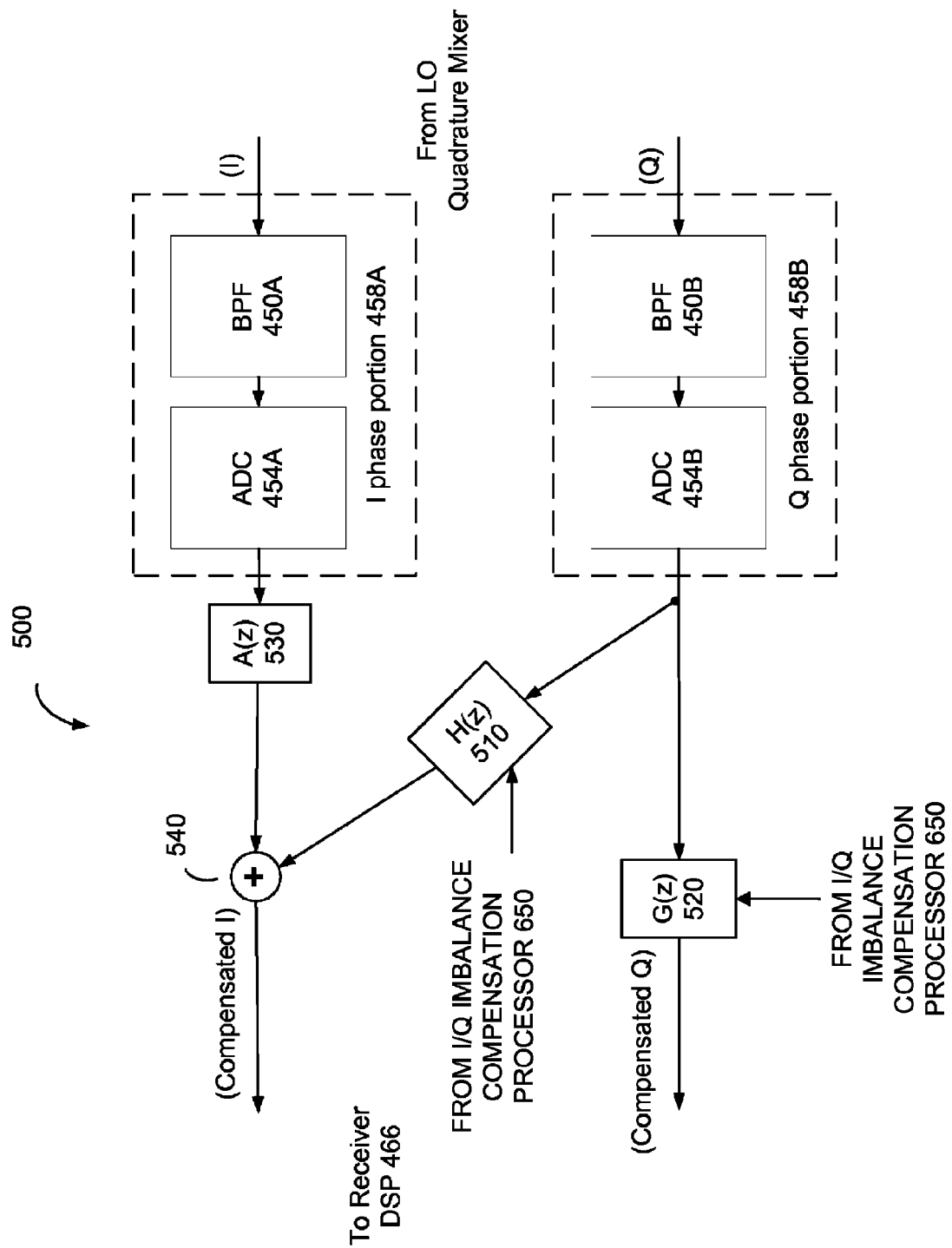
FIG. 5 is a block diagram illustrating an example I/Q imbalance compensation circuit of the receiver shown in FIG. 4.

FIG. 5 is block diagram of a circuit 500 that illustrates a first part of an example embodiment of the compensation module 456 shown in FIG. 4. The first part of the compensation module 456 is shown in conjunction with the in-phase portion 458A and quadrature-phase portion 458B of the receiver 404. The circuit 500 shown in FIG. 5 may be used to asymmetrically compensate for frequency dependent and frequency independent phase and amplitude imbalances in a received wireless signal.

As is shown in FIG. 5 and was discussed above with respect to FIG. 4, the in-phase portion 458A and the quadrature-phase portion 458B receive, respectively, an in-phase signal (I) and a quadrature-phase signal (Q) from an LO quadrature mixer, such as the mixer 462 show in FIG. 4. The in-phase portion 458A and the quadrature-phase portion 458B filter and convert the I and Q signals to digital I and Q signals that may include information from both a signal band and an image band, as was described above.

As was also described above, the digital I and Q signals produced by the in-phase portion 458A and the quadrature-phase portion 458B may also include imbalances (e.g., phase and amplitude) that are introduced by the quadrature mixer 462 (e.g., frequency independent imbalances) and the BPFs 450 (e.g., frequency dependent imbalances). The circuit 500 may compensate for both the frequency independent and frequency dependent imbalances using filters H(z) 510, G(z) 520, and A(z) 530, as well as combiner 540. This compensation produces compensated I and Q signals that may then be communicated to a receiver DSP, such as the receiver DSP 466, for signal processing. Such signal processing may include image signal rejection and further down conversion to baseband.

In an example embodiment, the filters H(z) 510, G(z) 520, and A(z) 530 may take the form of adjustable (e.g., variable) finite-impulse-response FIR filters. For example, in one embodiment, the filters H(z) 510, G(z) 520, and A(z) 530 may be implemented as "Type I" linear phase filters. Such filters are known and will not be described in detail here. Briefly, however, such linear phase filters have a constant delay across frequency. Accordingly, the phase change introduced by such linear phase filters varies linearly with frequency. Because such linear phase filters have a constant delay, they have the advantage that the delays contributed by filters H(z) 510 and G(z) 520 can easily be compensated for by implementing A(z) as a digital delay element so as to not introduce any further substantial phase imbalance into the I and Q signals. Of course, the filters H(z) 510, G(z) 520, and A(z) 530 may take other forms, such as infinite-impulse-response (IIR) filters, other types of linear phase filters, other types of FIR filters, all-pass filters, or any other type of filter that may be configured to compensate for frequency dependent (and frequency independent) variations between in-phase and quadrature-phase signals (e.g., such as phase and amplitude imbalances).

In an example embodiment where the filters H(z) 510, G(z) 520, and A(z) 530 are implemented as "Type-I" linear phase filters, the filters H(z) 510 and G(z) 520 may each be configured to compensate for I/Q imbalances using a plurality of delay elements and a corresponding set of tap coefficients that determine the variable operation of the filters, whereas A(z) 530 can be configured as a digital delay element. The coefficients may be determined by an I/Q imbalance compensation processor based on a series of test tones, such as is described in further detail below with reference to FIG. 6.

The arrangement and number of delay elements and tap coefficients for the filters H(z) 510, G(z) 520, and A(z) 530 in a particular embodiment may depend on a number of factors and considerations. These factors and considerations include, but are not limited to, an image rejection ratio requirement for the receiver and an out of band signal gain requirement for the receiver. Out of band gain may be a consideration when implementing the filters H(z) 510, G(z) 520, and A(z) 530 because signals that are outside the relatively narrow IF signal band (e.g., between 100 KHz and 300 KHz) may introduce considerable noise in the receiver 404 if their gain is substantial through filters H(z) 510, G(z) 520, or A(z) 530. Therefore, when implementing such filters, it may be desirable to consider out of band performance along with in band performance so as not to introduce an unacceptable amount of out of band noise into the IF signals that are processed by the receiver 404 due to relatively high out of band signal gain.

In an example embodiment, the filters H(z) 510 and G(z) 520 may be implemented as "Type-I" linear phase filters including 64 total delays, where five nonzero coefficients are used for configuring the filters (e.g., the particular arrangement of delay elements used to process incoming signals), and A(z) 530 may be implemented as 32-sample digital delay element. Such a filter configuration for the filters 510, 520 and 530, when implemented in the circuit 500, may provide for an image rejection ratio of around 59 dB and out of band gain of less than 3 dB.

In the circuit 500, the filter H(z) 510 may be used compensate for frequency dependent and frequency independent phase imbalance between a digital in-phase signal (I) and a digital quadrature (Q) signal. These phase imbalances can be thought of as giving rise to a crosstalk term between the I and Q signals. Further in the circuit 500, the filter G(z) 520 may be used to compensate for a frequency dependent and a frequency independent amplitude imbalance between the phase-compensated digital I and Q signals. These amplitudes imbalances may be considered the result of a gain imbalance.

The circuit 500 may be said to compensate for phase and amplitude imbalances asymmetrically as each imbalance is compensated for by modifying only one of the I and Q signals. For instance, the phase imbalances are compensated for by combining (using the combiner 540) a filtered version of the quadrature-phase signal with the in-phase signal. As was discussed above, the phase imbalance at each frequency may be expressed as a trigonometric function, where the function expressing the imbalance depends on the particular embodiment. Accordingly, the filter H(z) may operate to implement these trigonometric functions to compensate for the phase imbalance between the digital I and Q signals across the entire IF frequency band (e.g., between 100 KHz and 300 KHz).

Similarly, in the circuit 500, the amplitude imbalances may be asymmetrically compensated for using the filter G(z) 520. As shown in FIG. 5, the filter G(z) is included in the quadrature-phase signal path. In similar fashion as the filter H(z) 510, the filter G(z) 520 may implement appropriate frequency-dependent trigonometric functions to compensate for amplitude imbalances between digital I and Q signals across the entire IF frequency band.

While an asymmetric compensation arrangement is shown in FIG. 5, other arrangements are possible. For instance, phase imbalances in a wireless receiver may be compensated for using two linear phase filters that are cross-coupled between the in-phase signal path and the quadrature-phase signal path. Similarly, amplitude imbalance may be compensated for using two linear phase filters, where each of signal paths (in-phase and quadrature) includes one of the filters. Such an arrangement may be referred to as symmetric imbalance compensation, as phase and amplitude imbalances are compensated for by modifying both an in-phase and a quadrature-phase signal.

In the circuit 500, the filter A(z) 530 may take the form of an all-pass filter in the IF frequency band which acts a phase shifter. Such an all-pass filter allows signals of all frequencies in the IF frequency band to pass through with unity gain, but introduces phase shifts to these signals. These phase shifts compensate for those introduced by the I/Q compensation filters H(z) 510 and G(z) 520. In an example embodiment where H(z) 510 and G(z) 520 are linear-phase filters with identical group delays, A(z) may be easily implemented as a digital delay element.

Figure 6:
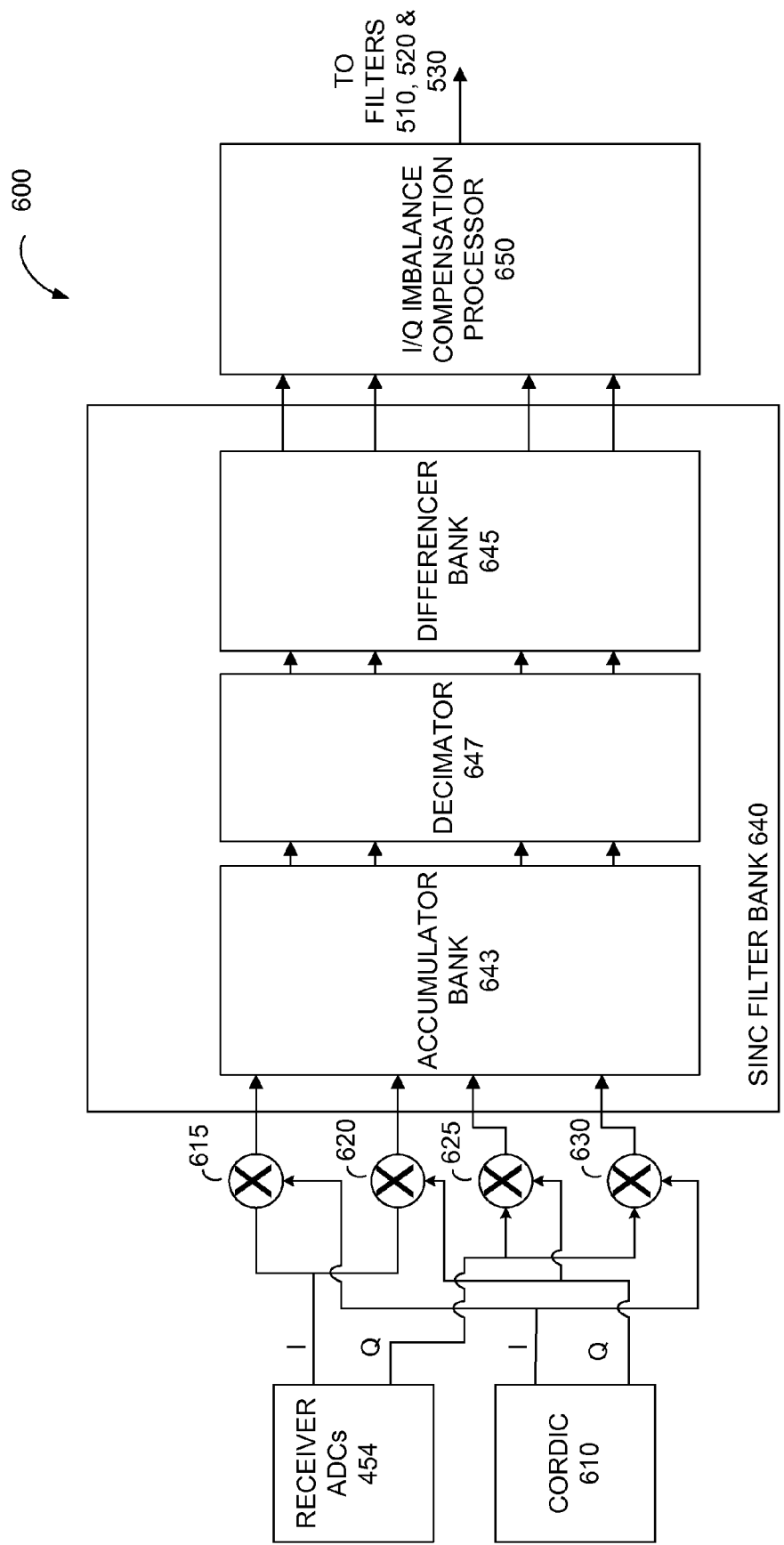
FIG. 6 is a block diagram illustrating an example I/Q imbalance measurement circuit of the receiver shown in FIG. 4.

FIG. 6 is a block diagram of a circuit 600 that may be used to determine the coefficients for the filters H(z) 510, G(z) 520, and A(z) 530 of the circuit 500 shown in FIG. 5. The circuit 600, which is a second part of the compensation module 456, may be used to determine the filter coefficients using a series (or plurality) of test tones (or frequencies). The number and frequencies of test tones used to determine the coefficients depends on the particular embodiment. In one example embodiment, five test tones may be used. In another example embodiment, two test tones may be used. In yet another example embodiment, five test tones may be used to determine an initial set of coefficients and two test tones whose frequencies vary across the five original test tones may be used to modify the initial set of coefficients during operation of the receiver. Of course, any number of test tones may be used. Further, any number of approaches may be used for determining an initial set of coefficients and then updating those coefficients. For instance, four test tones may be used to determine an initial set of coefficients and the coefficients may then be updated by also using four test tones.

In an example embodiment for a receiver that uses low side injection, the frequency of the test tones may be determined based on a local oscillator frequency for a selected channel. In this example, the test tones may be signals with frequencies that are distributed across the image band. For instance, using the example given above, the test tones may be determined based on a local oscillator frequency of 900 MHz (e.g., which corresponds with a desired channel frequency of 900.2 MHz). In this example embodiment, test tones corresponding with frequencies in the image band of −100 KHz, −200 KHz and −300 KHz relative to the LO frequency may be used. For this example, the frequency of the test tones would then be 899.9 MHz, 899.8 MHz and 899.7 MHz, respectively.

The test tones may be communicated to a quadrature LO mixer of a wireless receiver, such as the mixer 462 of the receiver 404, from a transmitter portion of a wireless transceiver, such as the transmitter 202 of the wireless transceiver 102. The test tones are then down converted to I and Q IF signals using the quadrature mixer 462 with an LO of 900 MHz in this example. This down conversion may also down convert signal information from the signal band (e.g., 900.1 MHz to 900.3 MHz).

The down converted test tones are then filtered using BPFs, such as BPFs 450, and converted to digital I and Q signals corresponding with the test tone using ADCs 454. In an example embodiment, the test tones may be provided to the circuit 600 in a serial fashion. In such an approach, a phase imbalance and an amplitude imbalance between an in-phase signal and quadrature-phase signal of each test tone may be determined in turn. Once the imbalances for each test tone are determined, a set of filter coefficients may be determined from the determined imbalances for the plurality of test tones. Using the circuit 600, the imbalances for each test tone and the coefficients for the filters 510, 520, and 530 may be determined in the following manner.

As was described above, digital I and Q signals for the test tones are provided by the ADCs 454. In the circuit 600, a coordinate rotational digital computer (CORDIC) 610 may be used to generate a digital in-phase reference signal and a digital quadrature-phase reference signal corresponding with a given test tone. A CORDIC may be an apparatus implemented in software, hardware and/or firmware that is used to calculate trigonometric functions to a desired precision. The digital in-phase reference signal and the digital quadrature-phase reference signal generated by the CORDIC 610 for a given test tone may represent an in-phase signal and a quadrature-phase signal at a frequency of the test tone with substantially equal magnitude and substantially 90 degree phase separation with respect to each other. Of course, other techniques for generating the digital reference signals are possible.

As shown in FIG. 6, the in-phase signal and the quadrature-phase signal of the test tone (from the ADCs 454) are mixed with the digital in-phase reference signal and the digital quadrature-phase reference signal to produce a plurality of mixed signals. For instance, the digital in-phase reference signal corresponding with the test tone may be mixed with the in-phase signal of the test tone (using a mixer 615) and the quadrature-phase signal of the test tone (using a mixer 630) to generate first and second mixed signals. Likewise, the digital quadrature-phase reference signal corresponding with the test tone may be mixed with the in-phase signal of the test tone (using a mixer 620) and the quadrature-phase signal of the test tone (using a mixer 625) to generate third and fourth mixed signals.

The first, second, third and fourth mixed signals may then be provided to a variable sinc filter bank 640 (e.g., implementing four filters in this example), where the sinc filters of the sinc filter bank 640 are configured for each test tone and low pass filter and notch harmonic (e.g., double frequency) components of the mixed signals. The mixed signal harmonics may be notched, for example, using a filter element that blocks or suppresses a relatively narrow range of frequencies. Such a filter element may be included in the variable sinc filter. The variable sinc filter bank 640 may then extract respective direct current (dc) signal components from the first, second, third and fourth mixed signals. The extracted dc signal components may then be provided to an I/Q imbalance processor 650 that may be implemented using hardware, software and/or firmware. The processor 650 may apply service logic to determine a phase imbalance and amplitude imbalance between the I and Q signals of each test tone relative to the digital reference I and Q signals based on the extracted dc signal components. Once the imbalances for each test tone are determined, the processor 650 may then apply additional service logic to determine a set of filter coefficients for the filters 510, 520 and 530. These coefficients may be calculated to obtain substantially ideal I/Q balance at the frequencies of the test tones, while the remaining frequencies in the IF frequency band may obtain sufficient I/Q balance as a consequence of natural frequency interpolation provided by the filters H(z) 510 and G(z) 520 between the test tone frequencies. Such filters may be referred to as frequency sampling filters. Those coefficients may then be applied to the filters 510, 520, and 530 and the filters may be used to compensate for I/Q imbalance in a received wireless signal at the selected channel frequency (e.g., 900.2 MHz in this example).

In an example embodiment, the variable sinc filter bank 640 may include an accumulator bank 643, a differencer bank 645 and a decimator 647. The accumulator bank 643 may, for example, include four blocks of three cascaded accumulators to process each of the four mixed signals, while the differencer bank 645 may include four blocks of three cascaded differencers for each of the four mixed signals. The decimator may provide the differencer bank 645 with sub-samples of the outputs of the accumulator bank 643 to extract the dc components from the mixed signals. The variable sinc filters of the sinc filter bank 640 may be configured based on the frequency of the particular test tone for which phase and amplitude imbalances are being determined. For instance, based on the test tone frequency, the sinc filter may enable specific accumulators in the accumulator bank 643 and specific differencers in the differencer bank 645. A decimation rate for the decimator 647 may also be determined based on the test tone frequency. The decimation rate will, in turn, determine the sub-sampling clock frequency. The use of such a variable sinc filter may be advantageous as it may allow for reducing the settling (convergence) time of the sinc filter bank 640 depending on the frequency of the test tone. Such an arrangement may result in a performance improvement for the I/Q imbalance compensation module 456 and, in turn, the wireless receiver 404.

I/Q Imbalance Compensation Method

Figure 7:
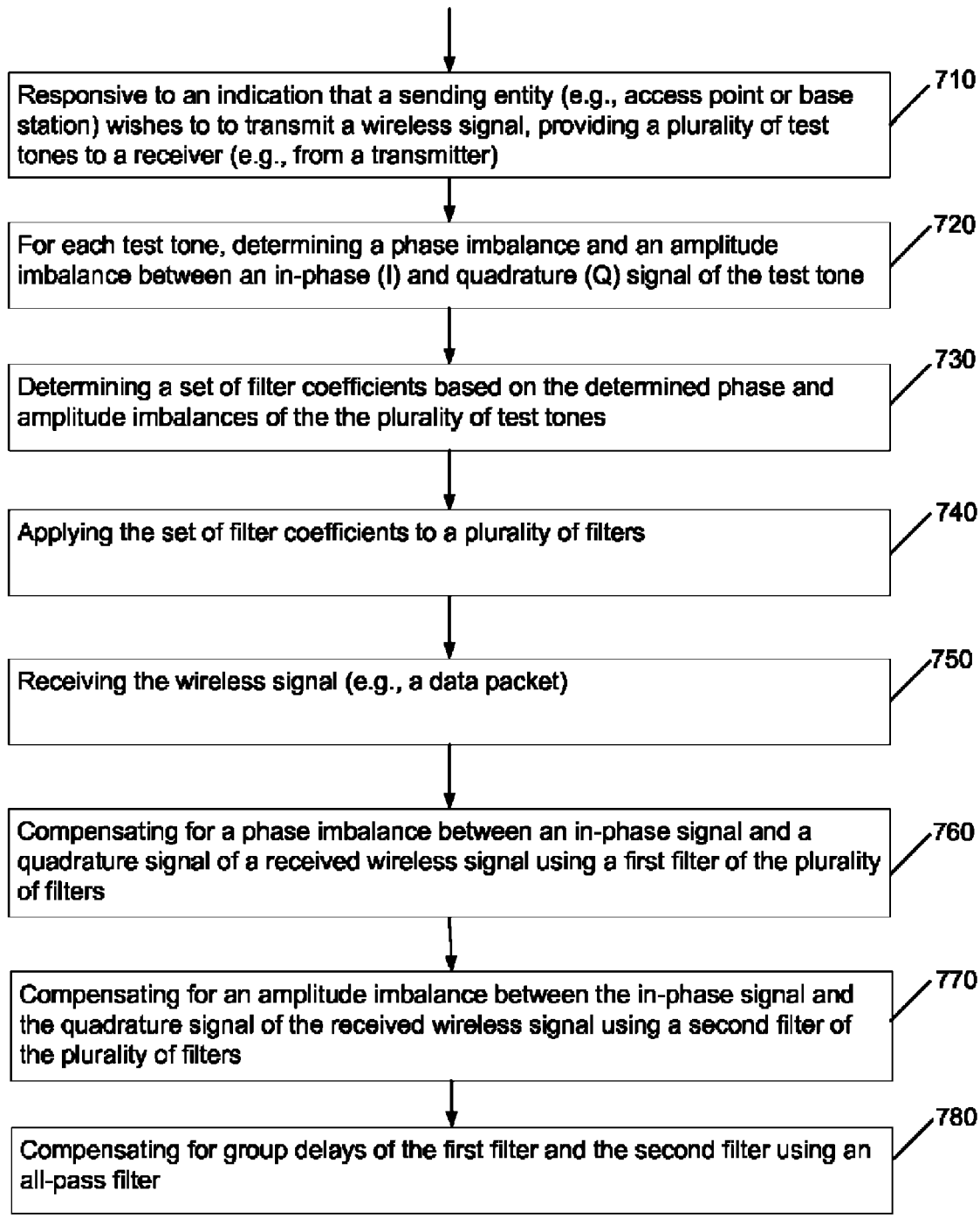
FIG. 7 is a flow chart illustrating a method for compensating for I/Q imbalance using test tones in a wireless receiver, such as the receiver illustrated in FIG. 4.

FIG. 7 illustrates a method of compensating for phase imbalance and amplitude imbalance between corresponding in-phase signals and quadrature-phase signals in a wireless receiver. It will be appreciated that the method of FIG. 7 is given by way of example and other methods may be implemented that do not include all of the aspects shown in FIG. 7, include additional aspects, or substitute other aspects for those illustrated in FIG. 7.

The method illustrated in FIG. 7 includes, at block 710, providing a plurality of test tones of various frequencies to the receiver in response to an indication that a sending entity wishes to send a wireless signal to the receiver. The indication may include a paging signal from a base station or a wireless access point. The wireless signal may include packet data or other information, such as streaming media. As was described above, the test tones may be provided to the receiver by a transmitter portion of a wireless transceiver that includes the receiver.

The method of FIG. 7 then includes, at block 720, determining, for each of the test tones, a respective phase imbalance and a respective amplitude imbalance between an in-phase signal and a quadrature-phase signal of the test tone. As described above, the respective phase imbalance and the respective amplitude imbalance may each have a frequency dependent component and a frequency independent component. The respective phase and amplitude imbalances may be determined in like fashion as was described above with respect to FIG. 6 and is further discussed below with respect to FIG. 8.

At block 730, the example method includes determining a set of filter coefficients based on the determined phase and amplitude imbalances of the plurality of test tones. The filter coefficients may be determined using a compensation processor, such as the compensation processor 650 shown in FIG. 6 and discussed above.

At block 740, the example method includes applying the set of filter coefficients to a plurality of filters. In an example embodiment, such filter coefficients may be applied to linear phase filters (e.g., H(z) 510 and G(z) 520) by providing the coefficients to the filters using a compensation processor, such as the compensation processor 650.

At block 750, the example method includes receiving the wireless signal. The wireless signal may include a first data packet. Depending on the particular embodiment, the plurality of test tones (or a subset of the test tones) may be provided to the receiver to determine (or update) the set of filter coefficients before receiving each data packet in a series of data packets. Various approaches for providing test tones were described above and those approaches may be implemented in conjunction with the example method and other such methods.

At block 760, the example method includes compensating for a phase imbalance between an in-phase signal and a quadrature-phase signal of the received wireless signal using a first filter of the plurality of filters. At block 770, the example method includes compensating for an amplitude imbalance between the in-phase signal and the quadrature-phase signal of the received wireless signal using a second filter of the plurality of filters. At block 770, the example method includes compensating for group delays of the first and second filters using an all-pass filter. In an example embodiment, these filters may comprise "Type I" linear phase filters, such as were described above.

Figure 8:
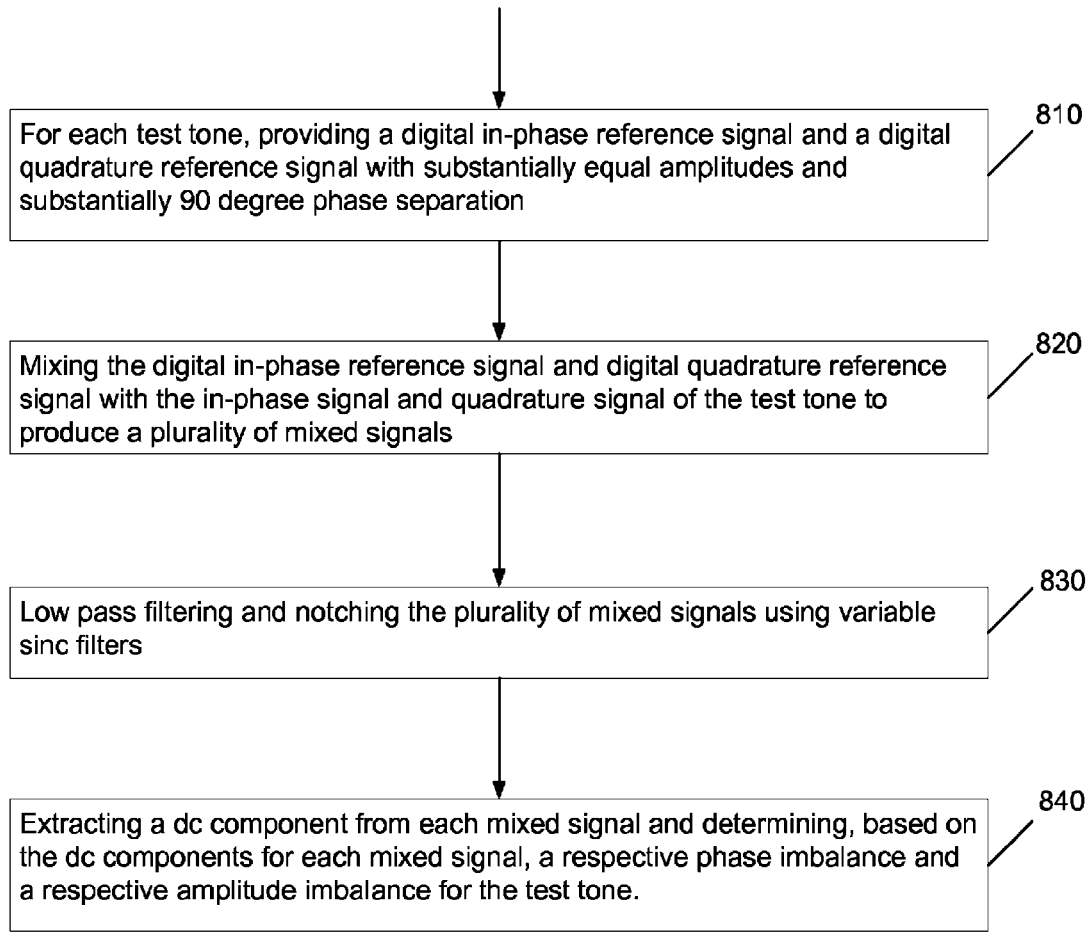
FIG. 8 is a flow chart illustrating a method for determining I/Q imbalance of a plurality of test tones that may be implemented as part of the method illustrated in FIG. 7.

FIG. 8 is a flowchart illustrating an example method for determining the respective phase imbalance and the respective amplitude imbalance between the in-phase signal and the quadrature-phase signal for each test tone. The method of FIG. 8 may be implemented as part of the method illustrated in FIG. 7. Further, the method of FIG. 8 may be used for each test tone that is provided to a wireless receiver in a series of test tones that are used to either determine a set of filter coefficients (or update a previously determined set of coefficients), as was previously described.

The method of FIG. 8 includes, at block 810, providing a digital in-phase reference signal and a digital quadrature-phase reference signal corresponding with the test tone, wherein the digital in-phase reference signal and the digital quadrature-phase reference signal represent an in-phase signal and a quadrature-phase signal at a frequency of the test tone with substantially equal magnitude and substantially 90 degree phase separation with respect to each other.

At block 820, the example method includes mixing the in-phase signal and the quadrature-phase signal of the test tone with the digital in-phase reference signal and the digital quadrature-phase reference signal to produce a plurality of mixed signals. At block 830, the example method includes low pass filtering and notching the plurality of mixed signals using variable sinc filters, such as was described above with respect to FIG. 6.

At block 840, the example method includes extracting a dc component from each mixed signal and determining, based on the dc components for each mixed signal, a respective phase imbalance and a respective amplitude imbalance for the test tone. As was discussed above with respect to FIG. 6, the dc components of the mixed signals may be extracted using variable sinc filters 640.

CONCLUSION

While a number of aspects and embodiments have been discussed above, it will be appreciated that various modifications, permutations, additions and/or sub-combinations of these aspects and embodiments are possible. It is therefore intended that the following appended claims and claims hereafter introduced are interpreted to include all such modifications, permutations, additions and/or sub-combinations as are within their true spirit and scope.

We claim:

1. A method of compensating for phase imbalance and amplitude imbalance between corresponding in-phase signals and quadrature-phase signals in a wireless receiver, the method comprising:

providing a plurality of test tones of various frequencies to the receiver;

determining, for each of the test tones, a respective phase imbalance and a respective amplitude imbalance between an in-phase signal and a quadrature-phase signal of the test tone, the respective phase imbalance and the respective amplitude imbalance each having a frequency dependent component;

determining a set of filter coefficients based on the determined phase and amplitude imbalances of the plurality of test tones;

applying the set of filter coefficients to a plurality of filters;

compensating for a frequency dependent phase imbalance between an in-phase signal and a quadrature-phase signal of a received wireless signal using a first filter of the plurality of filters; and compensating for a frequency dependent amplitude imbalance between the in-phase signal and the quadrature-phase signal of the received wireless signal using a second filter of the plurality of filters.

2. The method of claim 1, wherein the plurality of test tones is provided to the receiver in response to an indication that a sending entity wishes to send the wireless signal, the indication including a paging signal from one of a base station and an access point.

3. The method of claim 2, wherein the wireless signal comprises a first data packet.

4. The method of claim 3, wherein the plurality of test tones is provided to the receiver prior to receiving the first data packet; and a subset of the plurality of test tones is provided to the receiver after the receiver receives the first data packet and before the receiver receives additional data packets.

5. The method of claim 1, wherein the first filter compensates for the phase imbalance asymmetrically and the second filter compensates for the amplitude imbalance asymmetrically.

6. The method of claim 1, further comprising:

compensating for a frequency independent phase imbalance between the in-phase signal and the quadrature-phase signal of the received wireless signal using the first filter; and compensating for a frequency independent amplitude imbalance between the in-phase signal and the quadrature-phase signal of the received wireless signal using the second filter.

7. The method of claim 1, wherein the plurality of test tones is provided to the receiver from a transmitter portion of a wireless transceiver, the wireless transceiver including the receiver.

8. The method of claim 1, wherein determining the respective phase imbalance and the respective amplitude imbalance between the in-phase signal and the quadrature-phase signal for each test tone comprises, per test tone:

providing a digital in-phase reference signal and a digital quadrature-phase reference signal corresponding with the test tone, wherein the digital in-phase reference signal and the digital quadrature-phase reference signal represent an in-phase signal and a quadrature-phase signal at a frequency of the test tone with substantially equal magnitude and substantially 90 degree phase separation with respect to each other;

mixing the in-phase signal and the quadrature-phase signal of the test tone with the digital in-phase reference signal and the digital quadrature-phase reference signal to produce a plurality of mixed signals; and filtering and processing the plurality of mixed signals to determine the phase imbalance and the amplitude imbalance between the in-phase signal and the quadrature-phase signal of the test tone.

9. The method of claim 8, wherein filtering and processing the plurality of mixed signals comprises low pass filtering and notching the plurality of mixed signals using a variable sinc filter including an accumulator, a differencer and a decimator, the variable sinc filter being configured based on the frequency of the test tone.

10. The method of claim 8, wherein:

the first filter comprises a first linear-phase filter; and the second filter comprises a second linear-phase filter.

11. The method of claim 10, wherein the plurality of filters also includes an all-pass filter adapted to compensate for group delays of the first linear-phase filter and the second linear-phase filter.

12. The method of claim 10, wherein the first linear-phase filter and the second linear-phase filter are "Type I" linear-phase filters.

13. A wireless transceiver comprising:

a transmitter adapted to output a series of test tones at various frequencies;

a receiver coupled with the transmitter so as to receive the series of test tones from the transmitter;

an imbalance measurement circuit coupled with the receiver, the imbalance measurement circuit adapted to:

determine a respective phase imbalance and a respective amplitude imbalance between an in-phase signal and a quadrature-phase signal for each test tone of the series of test tones; and determine a set of filter coefficients based on the determined phase and amplitude imbalances of the series of test tones; and a plurality of filters adapted to, using the determined filter coefficients, compensate for a phase imbalance and an amplitude imbalance between an in-phase signal and a quadrature-phase signal of a wireless signal received by the wireless transceiver, wherein the plurality of filters comprises:

a first linear-phase filter adapted to compensate for the phase imbalance between the in-phase signal and the quadrature-phase signal of the wireless signal, the first linear-phase filter being coupled between a quadrature-phase signal path and an in-phase signal path in the receiver; and a second linear-phase filter adapted to compensate for the amplitude imbalance between the in-phase signal and the quadrature-phase signal of the wireless signal, the second linear-phase filter being included in the quadrature-phase signal path.

14. The wireless transceiver of claim 13, wherein the imbalance measurement circuit comprises:

a reference circuit adapted to provide (i) a digital in-phase reference signal corresponding with each test tone and (ii) a digital quadrature-phase reference signal corresponding with each test tone;

a plurality of mixers coupled with the reference circuit and the receiver, the mixers adapted to, for each test tone:

mix the digital in-phase reference signal corresponding with the test tone with the in-phase signal of the test tone and the quadrature-phase signal of the test tone to generate first and second mixed signals;

mix the digital quadrature-phase reference signal corresponding with the test tone with the in-phase signal of the test tone and the quadrature-phase signal of the test tone to generate third and fourth mixed signals;

a filter adapted to extract respective direct current (dc) signal components from the first, second, third and fourth mixed signals; and a compensation processor adapted to:

determine, based on the respective dc components of the first, second, third and fourth mixed signals corresponding with each test tone, a respective phase imbalance and a respective amplitude imbalance between the in-phase signal and the quadrature-phase signal for each test tone; and determine the set of filter coefficients based on the determined phase and amplitude imbalances of the series of test tones.

15. The wireless transceiver of claim 14, wherein the reference circuit comprises a Coordinate Rotation Digital Computer (CORDIC), the CORDIC comprising at least one of hardware, software and firmware.

16. The wireless transceiver of claim 13, wherein the plurality of filters further comprises an all-pass filter adapted to compensate for group delays of the first and second linear-phase filters, the all-pass filter being included in the in-phase signal path.

17. The wireless transceiver of claim 13, wherein the first and second linear-phase filters are "Type I" linear-phase filters.

18. A method of compensating for imbalance between in-phase signals and corresponding quadrature-phase signals in a wireless transceiver, the method comprising:

responsive to an indication that a sending entity wishes to transmit a wireless signal to the wireless transceiver, providing a plurality of test tones from a transmitter portion of the wireless transceiver to a receiver portion of the wireless transceiver;

for each of the test tones:

providing a digital in-phase reference signal and a digital quadrature-phase reference signal corresponding with the test tone, wherein the digital in-phase reference signal and the digital quadrature-phase reference signal represent an in-phase signal and a quadrature-phase signal at a frequency of the test tone with substantially equal magnitude and substantially 90 degree phase separation with respect to each other;

mixing an in-phase signal and a quadrature-phase signal of the test tone with the digital in-phase reference signal and the digital quadrature-phase reference signal to produce a plurality of mixed signals;

filtering and processing the plurality of mixed signals to determine a phase imbalance and an amplitude imbalance between the in-phase signal and the quadrature-phase signal of the test tone;

determining a set of filter coefficients based on the determined phase and amplitude imbalances of the plurality of test tones;

applying the set of filter coefficients to a plurality of filters;

receiving the wireless signal;

compensating for a phase imbalance between an in-phase signal and a quadrature-phase signal of the received wireless signal using a first filter of the plurality of filters; and compensating for an amplitude imbalance between the in-phase signal and the quadrature-phase signal of the received wireless signal using a second filter of the plurality of filters.

19. The method of claim 18, wherein filtering and processing the plurality of mixed signals comprises low pass filtering and notching the plurality of mixed signals using a variable sinc filter comprising an accumulator, a differencer and a decimator, the variable sinc filter being configured based on the respective test tone frequency, and the method further comprises:

compensating for group delays of the first linear-phase filter and the second linear-phase filter using an all-pass filter, wherein the first filter comprises a first "Type-I" linear-phase filter and the second filter comprises a second "Type I" linear-phase filter.

* * * * *